United States Patent [19]
Vo et al.

[11] Patent Number: 5,488,584
[45] Date of Patent: Jan. 30, 1996

[54] CIRCUIT AND METHOD FOR EXTERNALLY CONTROLLING SIGNAL DEVELOPMENT IN A SERIAL ACCESS MEMORY

[75] Inventors: Huy T. Vo; Loren L. Mclaury, both of Boise, Id.

[73] Assignee: Micron Technology, Inc., Boise, Id.

[21] Appl. No.: 296,397

[22] Filed: Aug. 26, 1994

[51] Int. Cl.$^6$ ........................................... G11C 7/00
[52] U.S. Cl. .................. 365/203; 365/190; 365/191; 365/205; 365/233
[58] Field of Search ............... 365/189.04, 203, 365/205, 221, 230.05, 230.09, 189.05, 190, 233, 191

[56] References Cited

U.S. PATENT DOCUMENTS

| | | | |
|---|---|---|---|
| 5,282,166 | 1/1994 | Ozaki | 365/203 |
| 5,315,555 | 5/1994 | Choi | 365/203 X |
| 5,325,502 | 6/1994 | McLaury | 395/424 |
| 5,367,488 | 11/1994 | An | 365/203 X |
| 5,386,389 | 1/1995 | Taoka | 365/205 X |

*Primary Examiner*—David C. Nelms
*Assistant Examiner*—Son Mai
*Attorney, Agent, or Firm*—Seed and Berry

[57] ABSTRACT

A multiport memory having a serial access memory device. The serial access memory device is comprised of serial memory cells and a serial port. The serial memory cells store electrical information which is accessed serially. The information in a selected cell is developed in a sampling circuit to create an amplified signal which may be coupled to the serial port. The amount of signal developed in the sampling circuit is externally controlled by a user when the user controls the frequency of an external control signal. The frequency of the external control signal determines the length of time the signal is developed and therefore the amplitude of the signal. In one embodiment an isolation circuit isolates or couples the sampling circuit to a serial information node and alternately isolates or couples the sampling circuit to the serial port. The external control signal controls the signal development by controlling the time the sampling circuit is coupled to the serial information nodes.

15 Claims, 3 Drawing Sheets

CIRCUIT AND METHOD FOR EXTERNALLY CONTROLLING SIGNAL DEVELOPMENT IN A SERIAL ACCESS MEMORY

FIELD OF THE INVENTION

The invention relates to serially accessed multiport dynamic random access memories (DRAMs) and more particularly to the circuit and method for driving data between a serial memory cell and a serial port.

BACKGROUND OF THE INVENTION

A VRAM (video random access memory), sometimes called a dual port RAM (random access memory) or multiport DRAM (dynamic random access memory), is a DRAM having a serial access memory (SAM). The SAM permits a block of stored data to be rapidly accessed, while the normal access function of the DRAM is also occurring. The information in the SAM is normally obtained from, or input into, the DRAM portion of the VRAM which is accessed according to DRAM protocols.

Information may be written into the VRAM at DRAM address speeds and output through the serial access port, or vice versa. This is convenient for video applications because some address sequences, such as pixels in a raster scan, are predetermined.

In the mimed art multiport (DRAM), depicted in FIG. 1, an internally timed circuit triggers the latching of a helper flip-flop during a read operation of the serial access memory. Typically this internal timing is provided by a model built into the part. In FIG. 1 prior to the serial clock (SC), not shown, going high circuit 5 is turned on by ISOI, and a precharge circuit 10 is turned on by actuating transistors 15, 16, and 17 with the SPRE* signal. When SC goes high, circuit 10 is floated off and circuit 5 is off thereby isolating circuit 10 from circuit 20 which is strobed on. A decoder (not shown) is enabled before circuit 20 is strobed. The serial address is loaded to a counter (not shown) after the decoder is disabled. After the serial data is latched at NAND latch 30, all of the circuits 5, 10, 20, and 30 are returned to their respective normal states.

Loren L. McLaury's U.S. Pat. No. 5,325,502, entitled Pipelined SAM register Serial Output, is herein incorporated by reference to provide further background information.

SUMMARY OF THE INVENTION

The invention is a multiport memory having a serial access memory device. The serial access memory device is comprised of serial memory cells and a serial port. The serial memory cells store electrical information which is accessed serially. The information in a selected cell is developed and amplified in a sampling circuit to create a data signal representing the dam. The data signal is then coupled to the serial port. The amount of signal developed in the sampling circuit is externally controlled by a user when the user controls the frequency of an external control signal. The frequency of the external control signal determines the length of time the signal is developed and therefore the amplitude of the signal.

In one embodiment an isolation circuit alternately electrically isolates the sampling circuit from a serial information node and from the serial port. The serial information node receives data from a serial memory cell selected by a serial decoder. The isolation circuit isolates or couples the sampling circuit to the serial information nodes. The external control signal controls the signal development by controlling the time the sampling circuit is coupled to the serial information nodes.

The isolation circuit also allows for a double precharge. During a double precharge the serial information nodes and driver input nodes are alternately precharged. The driver input nodes are inputs to a driver circuit which drives the data to the serial port.

The invention improves cycle time (Tsc), access time (Tsac), and real time READ transfer specs (Ttsd/Ttsl) when operated in a serial output mode.

The improved cycle time of the invention pushes the performance of the VRAM or multiported DRAM to a maximum. The improved cycle time occurs when the user defines the period of the external control signal which then functions as a serial clock. The circuit and method of the invention work even if precharge of the serial information nodes is relatively short since the amplification time can be lengthened to compensate for a shortened precharge.

By disabling the serial decoder during the latching of the data signal to the serial port, the Ttsl specification is improved.

The improved access time either approaches or is equal to the access time of a full pipelined serial port DRAM. This improved access time is accomplished without the circuit overhead of the master-slave implementation used in the full pipeline circuit. In contrast to the full pipeline circuit which requires a complete internal cycle after the transfer has occurred (also known as look ahead load) the circuit of the invention only requires reenabling of the serial decoder, thereby realizing an improved Ttsd in the circuit of the invention over the full pipeline circuit.

DETAILED DESCRIPTION OF THE INVENTION

Figure 1:
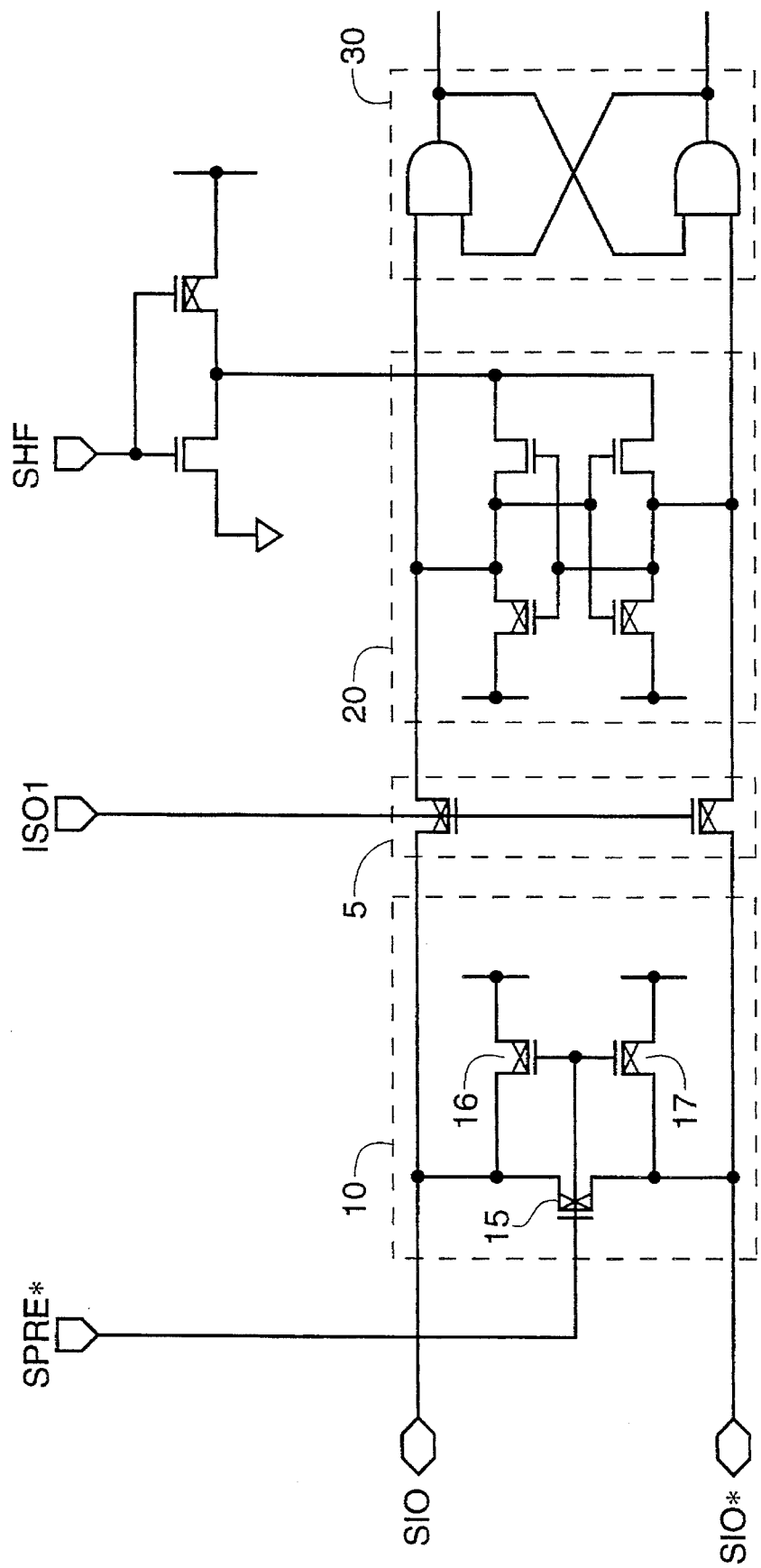
FIG. 1 is a schematic of a related art circuit.
Figure 2:
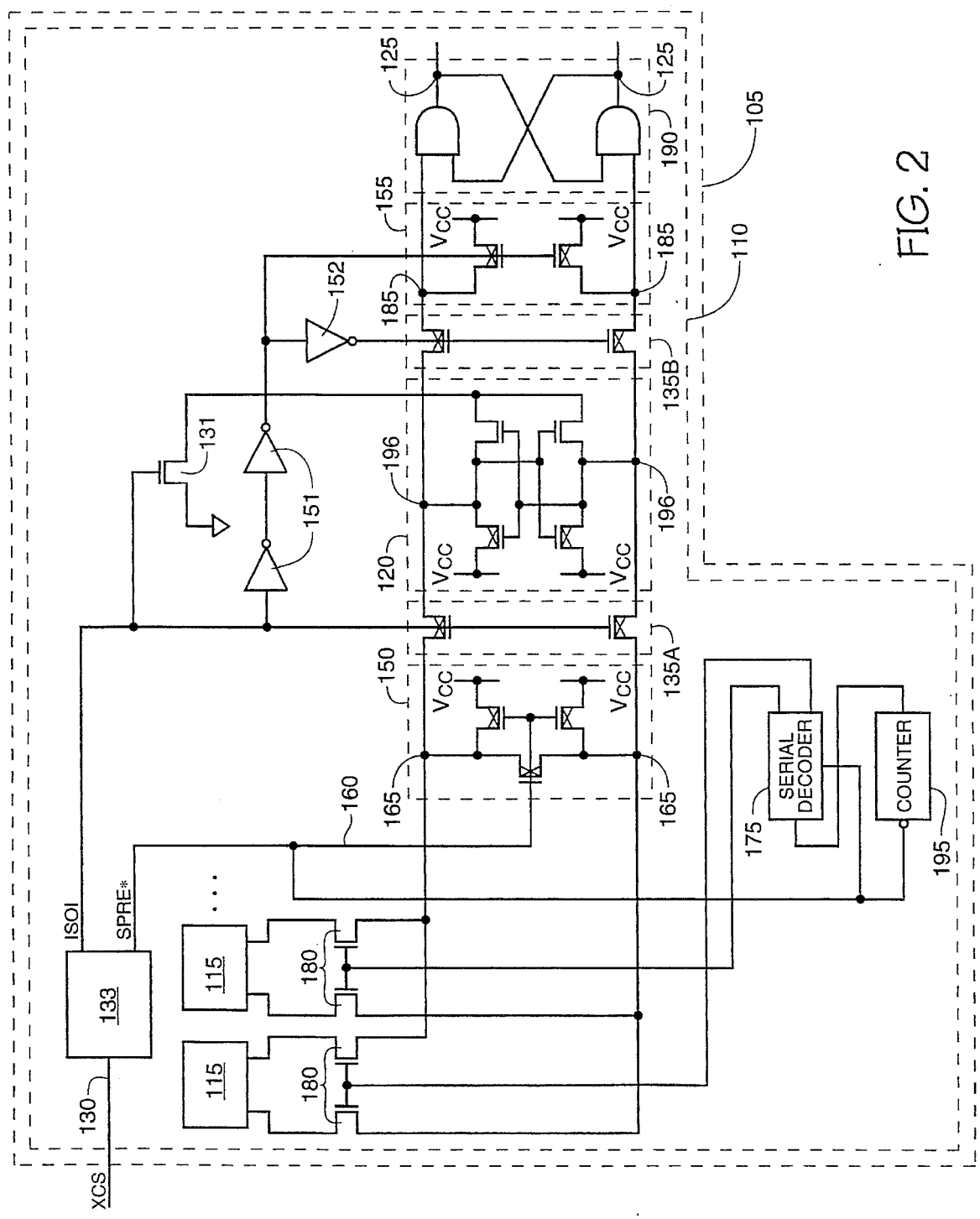
FIG. 2 is a schematic of the circuit of the invention.

FIG. 2 is a schematic representation of one embodiment of the multiport memory system 105 of the invention. The multiport memory system 105 comprises a serial access memory device 110 comprised of serial memory cells 115. The serial memory cells 115 store electrical information which is accessed serially. The information in a selected cell is developed in a sampling circuit 120. The sampling circuit 120 is a helper flip-flop which creates an amplified signal. The amplified signal is then coupled to a serial output port 125. The amount of signal developed in the sampling circuit 120 is externally controlled by a user when the user controls the frequency of an external control signal (XCS) at node 130. The frequency of the external control signal determines the length of time the signal is developed. The amount of signal developed has a direct affect on the total amplification of the original signal.

Figure 3:
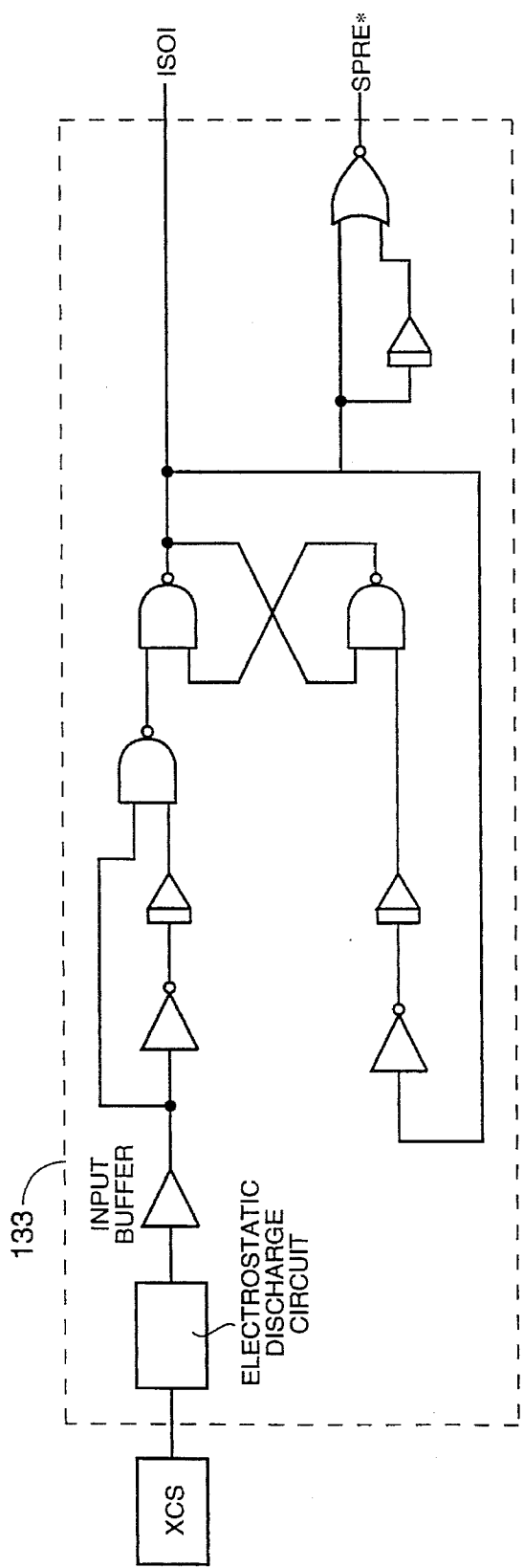
FIG. 3 is a schematic of a generator circuit of the invention.

FIG. 3 depicts the internal circuitry of a generation circuit 133 (shown as a block diagram in FIG. 2) which generates internal control signals, ISOI and SPRE*, in response to the external control signal. The ISOI signal is fed back in the generation circuit 133 to control the length of time ISOI is high.

In one embodiment the generation circuit 133 generates the ISOI signal in response to the external control signal in order to control an isolation circuit having isolation circuit portions 135A and 135B.

The isolation circuit portions 135A and 135B alternately electrically isolate the sampling circuit 120 from the serial information nodes 165 and from the serial output port 125. The isolation circuit portions 135A and 135B responds to ISOI to control the amount of signal development by controlling a length of time the signal is developed in the sampling circuit 120. During signal development the isolation circuit portion 135A couples the serial information nodes 165 to the sampling circuit 120. When coupled to the sampling circuit 120 one of the serial information nodes 165 is pulled toward a low potential while the remaining node remains at or near a high precharge potential. In fact, the data, and its complement, stored in the selected serial memory cell 115 may be amplified to such an extent that the serial information nodes are driven to full rail potentials.

Invertors 151 and invertor 152 invert ISOI to ensure transistors of isolation circuit portions 135A and 135B are alternately activated and deactivated. During sampling of the data in the sampling circuit 120, ISOI is low in order to activate the transistors of the isolation circuit portion 135A and deactivate the transistors in isolation circuit portion 135B. When the transistors of isolation circuit portion 135A are activated the isolation circuit portion 135A couples serial information nodes 165 to the sampling circuit 120, and the data coupled from the selected cell through access transistors 180 is developed in the sampling circuit. During development the deactivated transistors of isolation circuit portion 135B isolate the sampling circuit 120 from driver nodes 185. While isolated from the sampling circuit 120 the driver nodes 185 are precharged by precharge circuit 155. Precharge circuit 155 is activated by the low ISOI signal delayed in invertors 151. When activated precharge circuit 155 precharges driver nodes 185 to a high potential, leaving output latch circuit 190 in the previous set/data state.

In order to amplify the data, ISOI transitions high in response to the external control signal transitioning high, and the transistors of isolation circuit portion 135A are deactivated and the transistors of isolation circuit portion 135B are activated. The generation circuit 133 is designed to control the pulse width of the high ISOI signal while the user controls the pulse width of the low ISOI signal by controlling the frequency of the external control signal. Controlling the pulse width of the low ISOI signal controls the development and eventually amplification of the data signal. The activated transistors of isolation circuit portion 135B couple the amplified signal to the driver nodes 185 which are input nodes to output latch circuit 190. The data is then latched to the serial output port 125 by output latch circuit 190. It is important to note that in this embodiment the duty cycle of the external control signal is irrelevant and development and amplification is dependent on the frequency or period of the external control signal. However, in an alternate embodiment the generator circuit may be designed to respond to both the rising and falling edges of the external control signal and therefore be dependent on the duty cycle as well as the frequency of the external control signal.

Subsequent to the isolation of the sampling circuit 120 from the serial information nodes 165, SPRE* transitions low and the first precharge circuit 150 precharges serial information nodes 165 to a high potential. Thus the serial information nodes 165 are being precharged while the data is driven to the serial output port 125.

During the precharge of the serial information nodes 165 the counter 195 is incremented in response to the SPRE* signal and the serial decoder is disabled. When the precharge of serial information nodes 165 is terminated by circuit 133's time out sequence, the serial information nodes 165 are coupled to the sampling circuit 120 and the next serial bit of data is driven to the serial information nodes 165 through actuated access transistors 180, because the serial decoder is reenabled by SPRE* going high.

The invention improves cycle time (Tsc), access time (Tsac), and real time READ transfer specs (Ttsd/Ttsl) when operated in a serial outpro mode.

The improved cycle time pushes the performance of the VRAM to a maximum. The improved cycle time occurs when the user defines the period of the external control signal which functions as an external clock. The generation circuit 133 generates signals in response to the external control signal to create a shorter precharge of the serial information nodes 165. Sampling circuit nodes 196 are precharged when coupled to either precharged serial information nodes 165 or precharged nodes 185. The serial decoder 175 is disabled upon latching of the sampling circuit 120 thereby improving the Ttsl specification.

Figure 4:
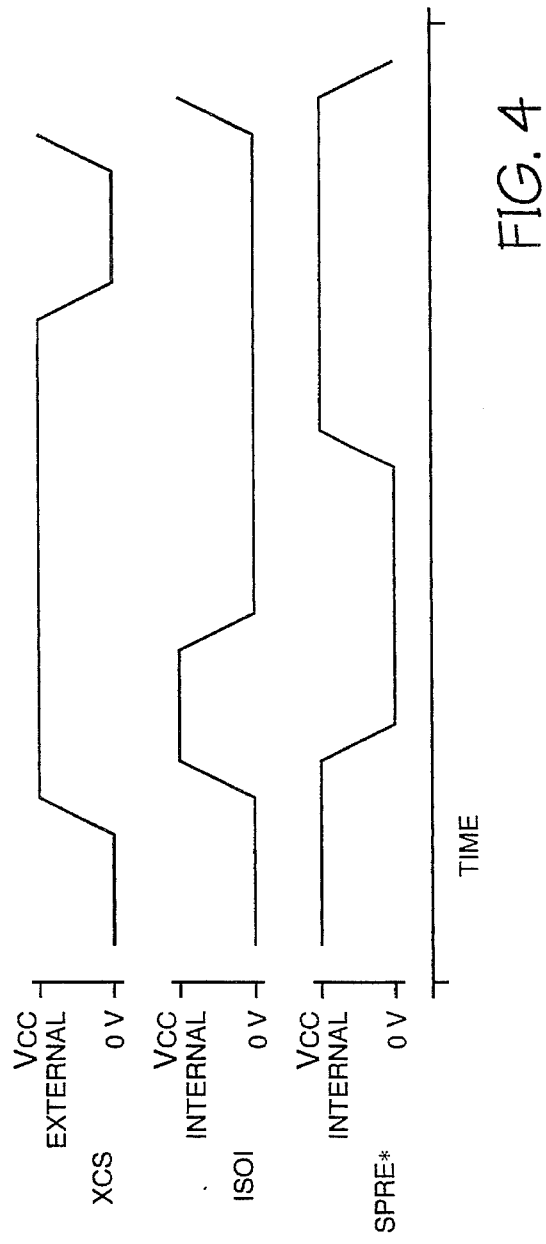
FIG. 4 is a timing diagram depicting the external control signal in relation to the generator output signals.

By studying the timing diagram shown in FIG. 4 in conjunction with the circuits of FIGS. 2 and 3 one skilled in the art can see that the generator circuit 133 produces a negative SPRE* pulse which controls the amount of time the serial information nodes 165 are precharged. The serial information nodes 165 are data lines and are also known as information nodes. This negative pulse is independent of the frequency of the external control signal. Since the period of the external control signal can be increased to compensate for a short precharge time during which the serial nodes do not reach a full precharge potential, the circuit works even if precharge of the serial information nodes is relatively short. When the period of the external control signal is increased without changing the circuitry of generator 133, the pulse width of the negative ISOI pulse is increased, resulting in more signal development on serial information nodes 165 and thus more signal development on the sampling circuit nodes 196.

The improved access time either approaches or is equal to the access time of a full pipelined serial port DRAM. This improved access time is accomplished without the circuit overhead of the master-slave implementation used in the full pipeline circuit. In contrast to the full pipeline circuit which requires a complete internal cycle after the transfer has occurred (also known as look ahead load) the circuit of the invention only requires reenabling of the serial decoder, thereby realizing an improved Ttsd in the circuit of the invention over the full pipeline circuit.

While the invention has been described for a serial access memory portion of a DRAM, it may be also be used in random access port DRAMs where the address is latched in a pipeline scheme with latency. Thus it will be apparent to those skilled in the art that the disclosed invention may be modified in numerous ways and may assume many embodiments other than those specifically set out and described above. According, it is intended by the appended claims to cover all modifications of the invention which fall within the true spirit and scope of the invention.

What is claimed is:

1. A multiport memory, comprising:
   a) a plurality of memory cells for storing a plurality of bits;

b) an output port for presenting a data signal representative of one of the plurality of bits of a selected one of said memory cells;

c) a sampling circuit electrically interposed between said memory cells and said output port, said sampling circuit receiving the bit of the selected memory cell, and said sampling circuit developing the data signal;

d) a control node for receiving an external control signal coupled to said sampling circuit, a frequency of the external control signal determined externally by a user, wherein the frequency of said external control signal controls an amount of development of said data signal by said sampling circuit, said data signal driven to said output port from said sampling circuit;

e) a first information node interposed between said plurality of memory cells and said sampling circuit;

f) a second information node interposed between said output port and said sampling circuit;

g) a generator circuit for generating an internal control signal in response to said external control signal, said internal control signal having a first pulse and a second pulse;

h) an isolation means responding to said internal control signal to alternately electrically isolate said sampling circuit from said first information node and from said second information node in order to control an amount of said signal development;

i) first precharge means for precharging said first information node to a first precharge potential; and j) a second precharge means for precharging said second information node to a second precharge potential, wherein said first information node is precharged when isolated from said sampling circuit and said second information node is precharged when isolated from said sampling circuit.

2. A multiport memory, comprising:

a) a plurality of memory cells for storing a plurality of bits;

b) an output port for presenting a data signal representative of one of the plurality of bits of a selected one of said memory cells;

c) a sampling circuit electrically interposed between said memory cells and said output port, said sampling circuit receiving the bit of the selected memory cell, and said sampling circuit developing the data signal;

d) a control node for receiving an external control signal coupled to said sampling circuit, a frequency of the external control signal determined externally by a user, wherein the frequency of said external control signal controls an amount of development of said data signal by said sampling circuit, said data signal driven to said output port from said sampling circuit;

e) a first information node interposed between said plurality of memory cells and said sampling circuit;

f) a second information node interposed between said output port and said sampling circuit;

g) a generator circuit for generating an internal control signal in response to said external control signal, said internal control signal having a first pulse and a second pulse, wherein a pulse width of said first pulse is controlled internally to said multiport memory, and wherein a pulse width of said second pulse is controlled by said external control signal, said first pulse initiated in response to a first transition of said external control signal, said second pulse initiated at a termination of said first pulse and terminated in response to a second transition of said external control signal; and h) an isolation means responding to said internal control signal to alternately electrically isolate said sampling circuit from said first information node and from said second information node in order to control an amount of said signal development.

3. The multiport memory as specified in claim 2, wherein said first and said second transitions have a same direction of transition.

4. A multiport memory, comprising:

a) a plurality of memory cells for storing a plurality of bits;

b) an output port for presenting a data signal representative of one of the plurality of bits of a selected one of said memory cells;

c) a sampling circuit electrically interposed between said memory cells and said output port, said sampling circuit receiving the bit of the selected memory cell, and said sampling circuit developing the data signal;

d) a control node for receiving an external control signal coupled to said sampling circuit, a frequency of the external control signal determined externally by a user, wherein the frequency of said external control signal controls an amount of development of said data signal by said sampling circuit, said data signal driven to said output port from said sampling circuit;

e) a first information node interposed between said plurality of memory cells and said sampling circuit;

f) a second information node interposed between said output port and said sampling circuit;

g) a generator circuit for generating an internal control signal in response to said external control signal, said internal control signal having a first pulse and a second pulse wherein a pulse width of said first pulse and a pulse width of said second pulse are controlled by said external control signal; and h) an isolation means responding to said internal control signal to alternately electrically isolate said sampling circuit from said first information node and from said second information node in order to control an amount of said signal development.

5. The multiport memory as specified in claim 4, wherein:

a) said first pulse is initiated in response to a first transition of said external control signal and is terminated in response to a second transition of said external signal; and wherein b) said second pulse is initiated in response to said second transition of said external signal and terminated in response to a third transition of said external control signal.

6. The multiport memory as specified in claim 5, wherein said first and said third transitions have a same direction of transition.

7. A multiport memory system, comprising:

a) a plurality of memory cells for storing a plurality of bits;

b) an output port for presenting a signal representing a value of a selected one of said bits;

c) a first information node in electrical communication with said plurality of said memory cells, said first information node for receiving said selected one of said bits from a selected one of said memory cells;

d) a first precharge circuit in electrical communication with said first information node, said first precharge circuit for precharging said first information node;

e) a sampling circuit for developing a value of said selected bit to create a developed signal;

f) a second information node in electrical communication with said output port, said second information node for receiving said developed signal from said sampling circuit, said sampling circuit electrically interposed between said first and said second information nodes;

g) a second precharge circuit in electrical communication with said second information node, said second precharge circuit for precharging said second information node;

h) a first isolation device electrically interposed between said first information node and said sampling circuit, said first isolation device isolating said sampling circuit from said first information node during a precharging of said first information node and coupling said sampling circuit to said first information node in order for said sampling circuit to receive said selected one of said bits from said first information node;

i) a second isolation device electrically interposed between said sampling circuit and said second information node, said second isolation device isolating said sampling circuit from said second information node during the precharging of said second information node and for coupling said sampling circuit to said second information node in order for said second information node to receive said developed signal from said sampling circuit; and j) an output driver circuit interposed between said second information node and said output port, said output driver circuit for driving said developed signal from said second information node to said output port.

8. The multiport memory as specified in claim 7, further comprising a control node for receiving an external control signal, a frequency of the external control signal determined externally by a user, said control node in electrical communication with said first and said second isolation devices, wherein the frequency of said external control signal controls an amount of development of said developed signal by said sampling circuit.

9. The multiport memory as specified in claim 8, further comprising a generator circuit for generating an internal control signal in response to said external control signal, said generator circuit interposed between said control node and said first isolation device and interposed between said control node and said second isolation device, said internal control signal having a first pulse and a second pulse, and said internal control signal controlling said first and said second isolation devices.

10. The multiport memory as specified in claim 9, wherein:

a) a pulse width of said first pulse is controlled internally in the multiport memory; and wherein b) a pulse width of said second pulse is controlled by said external control signal, said first pulse initiated in response to a first transition of said external control signal, said second pulse initiated at a termination of said first pulse and terminated in response to a second transition of said external control signal.

11. The multiport memory as specified in claim 10, wherein said first and said second transitions have a same direction of transition.

12. The multiport memory as specified in claim 9, wherein a pulse width of said first and said second pulses is controlled by said external control signal, said first pulse initiated in response to a first transition of said external control signal and terminated in response to a second transition of said external control signal, said second pulse initiated in response to said second transition and terminated in response to a third transition of said external control signal.

13. The multiport memory as specified in claim 12, wherein said first and said third transitions have a same direction of transition.

14. The multiport memory as specified in claim 9, further comprising an inversion device for inverting said first internal control signal to one of said first and said second isolation devices, wherein said first isolation device couples when said second isolation device isolates and wherein said first isolation device isolates when said second isolation device couples in response to said internal control signal.

15. The multiport memory as specified in claim 7, further comprising a serial decoder for selecting said memory device for access.

\* \* \* \* \*